(12) United States Patent
Khozikov

(10) Patent No.: US 12,405,299 B2
(45) Date of Patent: Sep. 2, 2025

(54) ARC FAULT DETECTION IN AN ELECTRICAL POWER DISTRIBUTION SYSTEM

(71) Applicant: The Boeing Company, Arlington, VA (US)

(72) Inventor: Vyacheslav Khozikov, Bellevue, WA (US)

(73) Assignee: The Boeing Company, Arlington, VA (US)

( * ) Notice: Subject to any disclaimer, the term of this patent is extended or adjusted under 35 U.S.C. 154(b) by 94 days.

(21) Appl. No.: 18/479,703

(22) Filed: Oct. 2, 2023

(65) Prior Publication Data

US 2025/0110168 A1   Apr. 3, 2025

(51) Int. Cl.
G01R 31/08 (2020.01)
G01R 31/00 (2006.01)

(52) U.S. Cl.
CPC ......... *G01R 31/086* (2013.01); *G01R 31/008* (2013.01)

(58) Field of Classification Search
USPC ........................................................ 324/519
See application file for complete search history.

(56) References Cited

U.S. PATENT DOCUMENTS

| 2018/0134408 A1* | 5/2018 | Handy | ............ H02H 3/16 |
| 2022/0006279 A1 | 1/2022 | Robles et al. | |
| 2023/0062548 A1 | 3/2023 | Channegowda et al. | |

FOREIGN PATENT DOCUMENTS

DE   112017003081 T5   3/2019

OTHER PUBLICATIONS

Abadie, C. et al., "Partial Discharges in Motor Fed by Inverter: From Detection to Winding Configuration," IEEE Transactions on Industry Applications, vol. 55, No. 2, Oct. 9, 2018, 10 pages.
European Patent Office, Extended European Search Report Issued in Application No. 24192739.1, Mar. 14, 2025, Germany, 9 pages.

* cited by examiner

*Primary Examiner* — Farhana A Hoque
(74) *Attorney, Agent, or Firm* — Alleman Hall & Tuttle LLP

(57) ABSTRACT

An arc fault detection system is disclosed. The arc fault detection system includes a plurality of capacitive arc fault sensors electrically connected to a plurality of different segments of an electrical power distribution system and an arc fault detector electrically connected to the plurality of capacitive arc fault sensors. Each capacitive arc fault sensor is configured to output an arc fault signal based at least on detecting a high frequency current generated from capacitively coupling with an electrical arc. The arc fault detector is configured to receive one or more arc fault signals from one or more capacitive arc fault sensors of the plurality of capacitive arc fault sensors and determine a location of an arc fault in the electrical power distribution system based at least on the one or more arc fault signals.

20 Claims, 7 Drawing Sheets

| SEGMENT | $V_{a1p}$ | $V_{a2p}$ | $V_{a3p}$ | $V_{a4p}$ |
|---|---|---|---|---|
| DC-PCP | H | H | M/L | M/L |
| PDP-MC1 | M/L | H | H | M/L |
| PDP-MC2 | M/L | H | M/L | H |

ARC FAULT DETECTION IN AN ELECTRICAL POWER DISTRIBUTION SYSTEM

FIELD

The present disclosure relates generally to the field of electronics, and more specifically to high-voltage electrical power distribution systems of an electrified airborne platform.

BACKGROUND

A conventional electrical power distribution system typically monitors for short circuit, overcurrent, and/or undervoltage conditions and performs mitigation operations based on detecting such conditions. However, the conventional electrical power distribution system is not able to detect an arc fault. An arc fault is when a discharge of electricity occurs between two or more conductors in an electrical system. This discharge of electricity generates heat that can cause degradation of various components in the electrical system. Lacking the ability to detect arc faults, a conventional electrical power distribution system is vulnerable to degradation when an arc fault does occur.

SUMMARY

An arc fault detection system is disclosed. The arc fault detection system includes a plurality of capacitive arc fault sensors electrically connected to a plurality of different segments of an electrical power distribution system and an arc fault detector electrically connected to the plurality of capacitive arc fault sensors. Each capacitive arc fault sensor is configured to output an arc fault signal based at least on detecting a high frequency current generated from capacitively coupling with an electrical arc. The arc fault detector is configured to receive one or more arc fault signals from one or more capacitive arc fault sensors of the plurality of capacitive arc fault sensors and determine a location of an arc fault in the electrical power distribution system based at least on the one or more arc fault signals.

The features and functions that have been discussed can be achieved independently in various embodiments or may be combined in yet other embodiments, further details of which can be seen with reference to the following description and drawings.

BRIEF DESCRIPTION OF THE DRAWINGS

FIG. 4 shows an example table including arc fault signal magnitudes generated by different capacitive arc fault sensors in response to an arc fault occurring in the electrical power distribution system shown in FIG. 3.

DETAILED DESCRIPTION

Figure 1:
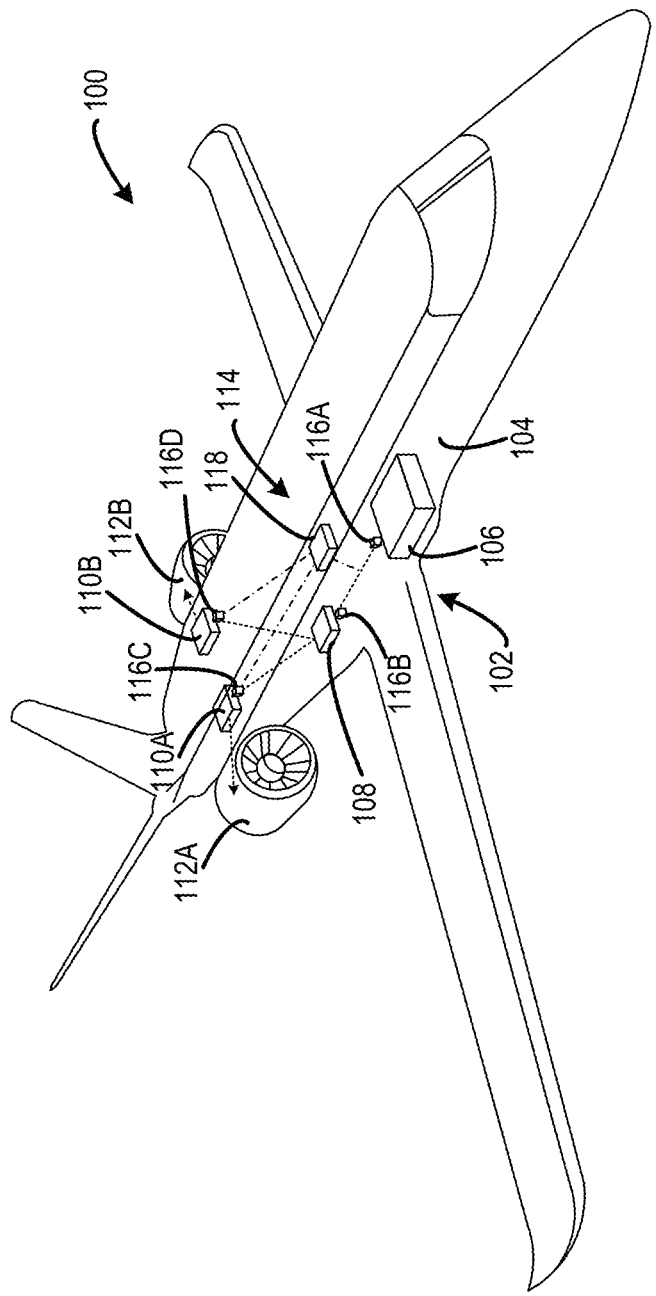
FIG. 1 schematically shows an example embodiment of an aircraft that includes an electrical power distribution system.

Detecting and locating arc faults in an electrical power distribution system presents various challenges. As one example, low-intensity arc faults, such as series arc faults, produce relatively small voltage drops (e.g., less than tens of volts) that can be difficult to detect in a high-voltage operating regime where operational voltage levels (e.g., hundreds of volts) are significantly greater than the relatively small voltage drops. As another example, in configurations where the electric distribution system includes a power source in the form of a battery, the normal operational voltage envelop may vary by up to 100% (e.g., from 800V when a battery is fully charged to 400V when the battery is discharged). The relatively large operational voltage envelope makes common mode measurements of voltage due to arc faults challenging due to dynamic changes in voltage of the power source throughout operation of the electrical power distribution system. As yet another example, in configurations where the electrical power distribution system includes one or more motors controlled by one or more corresponding motor controllers, voltage ripples from the motor controller(s) may reach substantial values (e.g., as high as the system voltage itself). Further, the electrical power distribution system typically includes cables that act as an attenuator of ripple voltage that make differential protection an inefficient measurement approach to detect arc faults.

Such challenges are heightened in a high-voltage electrical power distribution system, such as a high-voltage direct current (HVDC) electrical power distribution system that is employed in an all-electric or hybrid aircraft. Reliability of the electrical power distribution system plays a critical role in the operation of the all-electric or hybrid aircraft. The ability to detect and mitigate arc faults increases the reliability of the electrical power distribution system in the all-electric or hybrid aircraft relative to a system that lacks the ability to detect arc faults.

Accordingly, to address the above discussed challenges, as well as other challenges, the present description is directed to an arc fault detection system. In one example, the arc fault detection system includes a plurality of capacitive arc fault sensors electrically connected to a plurality of different segments of an electrical power distribution system and an arc fault detector electrically connected to the plurality of capacitive arc fault sensors. Each capacitive arc fault sensor is configured to output an arc fault signal based at least on detecting a high frequency current generated from capacitively coupling with an electrical arc. The arc fault detector is configured to receive one or more arc fault signals from one or more capacitive arc fault sensors of the plurality of capacitive arc fault sensors and determine a location of an arc fault in the electrical power distribution system based at least on the one or more arc fault signals.

The arc fault detection system provides various technical benefits. For example, each capacitive arc fault sensor is configured to detect an arc fault signature in the form of a high-frequency voltage distortion (e.g., a frequency exceeding 10 MHz and extending to the GHz range) generated from capacitively coupling with an electrical arc. By monitoring for arc faults in the high-frequency spectra, the capacitive arc fault sensors can reliably detect an arc fault even when the voltage distortion is relatively small. As another example, by detecting an arc fault based on capacitive coupling, common mode measurements that can be unreliable due to a large operational voltage envelope of the electrical distribution system can be avoided. As another example, since the capacitive arc fault sensors detect an arc fault based on capacitive coupling, the capacitive arc fault sensors are not required to be in direct physical contact with a conductor of a segment being monitored by the capacitive arc fault sensor. Since the capacitive arc fault sensors are not in direct physical contact with corresponding conductors of segments that are being monitored, high voltage/current is prevented from passing through the capacitive arc fault sensors to the arc fault detector and thereby causing degradation of the arc fault detector or other circuitry. As another example, when multiple capacitive arc fault sensors send arc fault signals indicating an arc fault to the arc fault detector, the arc fault detector is able to analyze the times of arrivals, the phases, and the magnitudes of the arc fault signals to accurately determine a location of the arc fault in the electrical power distribution system. The arc fault detection system may be particularly beneficial in all-electric/hybrid-electric aircraft applications to improve the robustness of the electrical system which is relied on for propulsion of the aircraft.

FIG. 1 schematically shows an example embodiment of an aircraft 100 including a HVDC electrical power distribution system 102. The HVDC electrical power distribution system 102 is positioned in a fuselage 104 of the aircraft 100. The HVDC electrical power distribution system 102 is configured to draw power from a DC power source in the form of a battery subsystem 106. The HVDC electrical power distribution system 102 includes a power distribution panel (PDP) 108 that is configured to distribute electrical power from the battery subsystem 106 to two parallel loads in the form of a pair of motor controllers 110A, 110B electrically connected to a corresponding pair of propulsion motors 112A, 112B.

An arc fault detection system 114 is configured to monitor operation of the HVDC electrical power distribution system 102 to detect and locate arc faults as they occur. The arc fault detection system 114 includes a plurality of capacitive arc fault sensors 116A, 116B, 116C, 116D electrically connected to a plurality of different segments of the HVDC electrical power distribution system 102. More particularly, a first capacitive arc fault sensor 116A is electrically connected to a terminal of the battery subsystem 106 and monitors a segment between the battery subsystem 106 and the PDP 108, a second capacitive arc fault sensor 116B is electrically connected to a terminal of the PDP 108 and monitors segments connected to the PDP 108, a third capacitive arc fault sensor 116C monitors a segment between the PDP 108 and a first motor controller 110A, and a fourth capacitive arc fault sensor 116D monitors a segment between the PDP 108 and a second motor controller 110B.

An arc fault detector 118 is electrically connected to each of the plurality of capacitive arc fault sensors 116A, 116B, 116C, 116D. Each capacitive arc fault sensor is configured to output an arc fault signal based at least on detecting a high frequency current generated from capacitively coupling with an electrical arc. In one example, high-frequency current refers to current having a frequency of e.g., 10 MHz and extending up to the GHz range. The arc fault detector 118 is configured to receive one or more arc fault signals from one or more capacitive arc fault sensors and determine a location of an arc fault in the electrical power distribution system 102 based at least on the one or more arc fault signals. In some scenarios, the arc fault detector 118 receives a plurality of arc fault signals from the plurality of capacitive arc fault sensors 116A, 116B, 116C, 116D and the arc fault detector 118 is configured to determine the location of the arc fault based at least on a difference in magnitudes of the plurality of arc fault signals, the times of arrivals, and/or a difference in phases of the plurality of arc fault signals, as will be described in further detail hereinbelow.

While the arc fault detection system 114 is described herein with reference to aircraft HVDC power distribution applications, this is in no way limiting. The disclosed arc fault detection systems may be employed in other applications, including HVAC power distribution, non-aircraft vehicle applications and non-vehicle applications.

Figure 2:
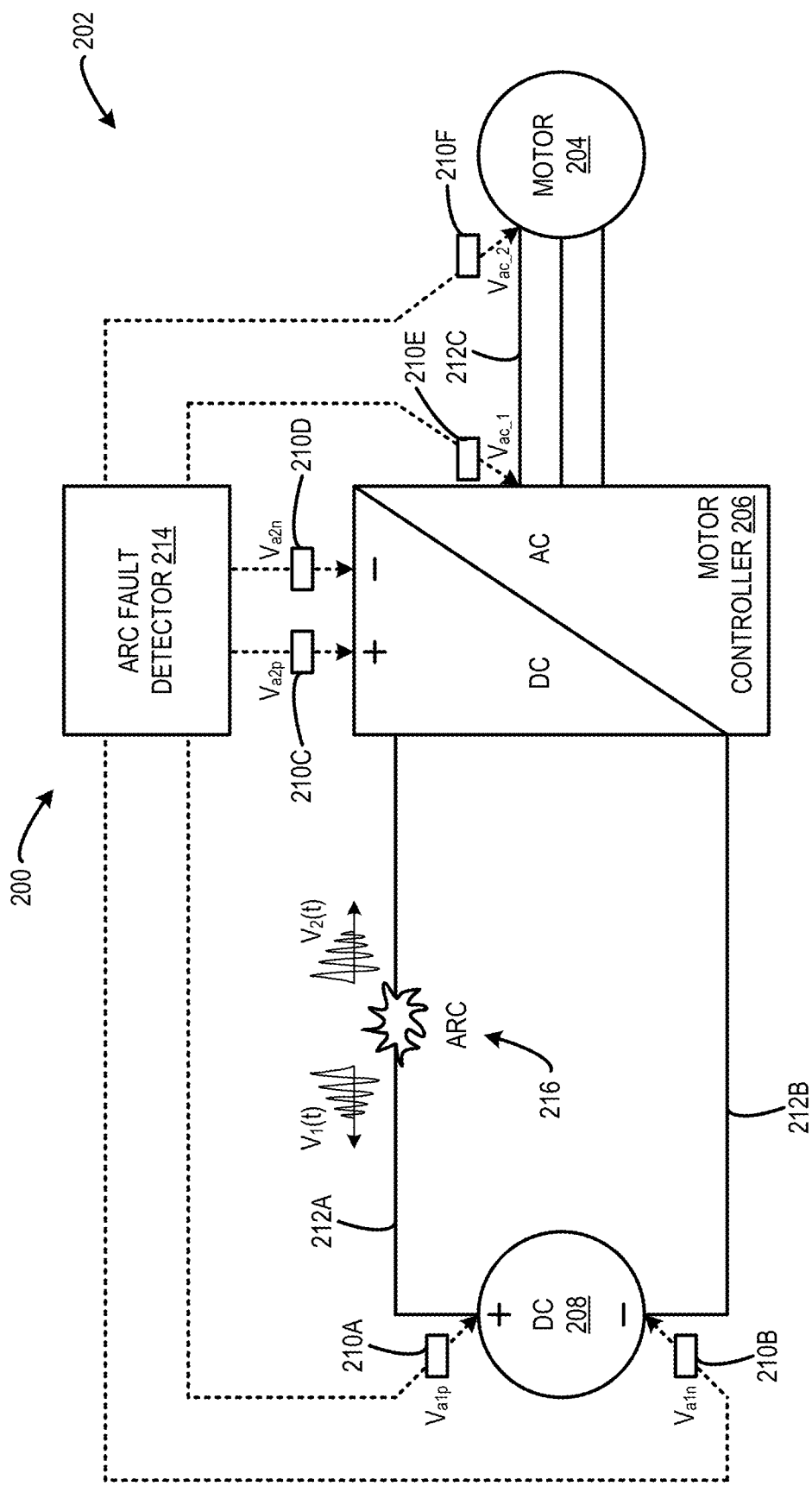
FIG. 2 schematically shows an example embodiment of an arc fault detection system for an electrical power distribution system including an electric motor.

FIG. 2 schematically shows an example embodiment of an arc fault detection system 200 for an electrical power distribution system 202. The electrical power distribution system 202 includes an electric motor 204 that is electrically connected to a motor controller 206. The motor controller 206 is electrically connected to a DC power source 208.

The motor controller 206 is configured to modulate electrical power received from the DC power source 208 to control the speed and/or torque of the electric motor 204. More particularly, the motor controller 206 is configured to receive control signals from an external source (not shown), such as a microcontroller or a manual control interface (e.g., a joystick, throttle, or buttons). These control signals dictate the desired speed and torque of the electric motor 204. The motor controller 206 is configured to processes the control signals using a control algorithm to determine the appropriate output to the electric motor 204. For example, the control algorithm may involve feedback mechanisms like a proportional-integral-derivative (PID) control for precise speed and position control. The motor controller 206 is configured to modulate the voltage and/or current supplied to the electric motor 204 based on the output of the control algorithm. The motor controller 206 may use various techniques to modulate the electrical power supplied to the electric motor 204, such as pulse-width modulation (PWM). The motor controller 206 is configured to send the modulated electrical power to the electric motor 204, and the electric motor 204 adjusts the speed and/or torque based on the modulated electrical power to provide a desired motor output.

In some embodiments, the electric motor 204 is an alternating current (AC) electric motor 204, and the motor controller 206 is configured to convert DC electrical power received from the DC power source 208 into AC electrical power that is suitable to control operation of the AC electric motor 204. In other embodiments, the electric motor 204 may be a DC electric motor 204, and the motor controller 206 may be configured to output DC electrical power to the DC electric motor 204.

The arc fault detection system 200 is configured to monitor operation of the electrical power distribution system 202 to detect and locate arc faults when they occur. The arc fault detection system 200 includes a plurality of capacitive arc fault sensors 210A, 210B, 210C, 210D, 210E, 210F electrically connected to different segments 212A, 212B of the electrical power distribution system 202. As used herein, segments of the electrical power distribution system refer to different electrical connections (e.g., cables, wires, connectors, rails) between electronic components of the electric power distribution system.

In the illustrated embodiment, a first capacitive arc fault sensor 210A is electrically connected to a first segment 212A at a positive output terminal of the DC power source 208. A second capacitive arc fault sensor 210B is electrically connected to a second segment 212B at a negative output terminal of the DC power source 208. A third capacitive arc fault sensor 210C is electrically connected to the first segment 212A at a positive input terminal of the motor controller 206. A fourth capacitive arc fault sensor 210D is electrically connected to the second segment 212B at a negative input terminal of the motor controller 206. The pair of capacitive arc fault sensors 210A and 210C monitor for arcing on the positive rail 212A between the DC power source 208 and the motor controller 206. The pair of capacitive arc fault sensors 210B and 210D monitor for arcing on the negative rail 212B between the DC power source 208 and the motor controller 206. The arc fault sensors 210A, 210B, 210C, 210D monitor the HVDC segments of the electrical power distribution system 202. Further, a fifth capacitive arc fault sensor 210E is electrically connected to a third segment 212C at an output terminal of the motor controller 206. A sixth capacitive arc fault sensor 210F is electrically connected to the third segment 212C at an input terminal of the electric motor 204. The pair of capacitive arc fault sensors 210E and 210F monitor for arcing on the third segment 212C between the motor controller 206 and the electric motor 204. The third segment 212C is an HVAC segment of the electrical power distribution system 202. The arc fault detection system 200 performs arc fault detection on the HVAC segment in a same or similar manner as performing arc fault detection on the HVDC segments of the electrical power distribution system 202.

The arc fault detection system 200 includes an arc fault detector 214 that is electrically connected to the plurality of capacitive arc fault sensors 210A, 210B, 210C, 210D, 210E, 210F. Each capacitive arc fault sensor of the plurality of capacitive arc fault sensors 210A, 210B, 210C, 210D, 210E, 210F is configured to output an arc fault signal based at least on detecting a high frequency current generated by an arc fault. In one example, the frequency range at which the capacitive arc fault sensors detect an arc fault is at least 10 MHz and extends up to the GHz range. In particular, each of the plurality of capacitive arc fault sensors 210A, 210B, 210C, 210D, 210E, 210F produce a voltage as a response to detecting the high frequency content of current generated from capacitively coupling with an electrical arc. The first capacitive arc fault sensor 210A outputs an arc fault signal having a voltage $V_{a1p}$. The second capacitive arc fault sensor 210B outputs an arc fault signal having a voltage $V_{a1n}$. The third capacitive arc fault sensor 210C outputs an arc fault signal having a voltage $V_{a1p}$. The fourth capacitive arc fault sensor 210D outputs an arc fault signal having a voltage $V_{a2n}$. The fifth capacitive arc fault sensor 210E outputs an arc fault signal having a voltage $V_{ac\_1}$. The sixth capacitive arc fault sensor 210F outputs an arc fault signal having a voltage $V_{ac\_2}$.

In the illustrated embodiment, an arc fault 216 is incepted on the positive segment 212A and generates an electrical energy wave that propagates bi-directionally along the positive segment 212A. The electrical energy wave produced by the arc fault 216 has a signature that is defined by a high-frequency voltage distortion. Upon the electrical energy wave reaching the first and third arc fault sensors 210A, 210C, the first and third arc fault sensors 210A, 210C report arc fault signals (e.g., $V_{a1p}$ and $V_{a2p}$) to the arc fault detector 214. Note that if an arc fault occurred in parallel across the positive and negative segments 212A, 212B, the capacitive arc fault sensors electrically connected to those segments would detect the arc fault and report arc fault signals in response.

Time delays, patterns of voltage distortion, along with the magnitude or intensity of an arc signal, may be used to determine a location of an arc fault. A magnitude of an arc fault signal may indicate a proximity of an arc fault to a corresponding capacitive arc fault sensor. For example, a greater magnitude of an arc fault signal indicates a closer proximity between an arc fault and a capacitive arc fault sensor than a lesser magnitude of an arc fault signal. However, a magnitude of an arc fault signal attenuates as the arc fault signal travels along a signal path (e.g., a wire). Further, a phase of an arc fault signal shifts because signals of different frequencies propagate at different speeds. Such magnitude attenuation and phase shifts can be a function of distance between an arc fault and a capacitive arc fault sensor as well as a distance between a capacitive arc fault sensor and the arc fault detector 214.

The arc fault detector 214 is configured to receive one or more arc fault signals from one or more capacitive arc fault sensors of the plurality of capacitive arc fault sensors 210A, 210B, 210C, 210D, 210E, 210F. In some embodiments, in order to accurately determine a location of an arc fault, the arc fault detector 214 may be configured to apply one or more correction factors to one or more phases (or times of arrivals) of one or more arc fault signals to account for propagation delays due to differences in lengths of signal paths of the plurality of arc fault signals. In some examples, the correction factor(s) may be a function of signal path lengths between each of the plurality of capacitive arc fault sensors 210A, 210B, 210C, 210D, 210E, 210F and the arc fault detector 214. Such correction factor(s) may normalize the phase differences of the different arc fault signals (and/or differences in times of arrivals) to account for the different signal path lengths so that phase-corrected magnitudes of the different arc fault signals can be assessed to accurately determine the location of an arc fault.

In other embodiments, each of the plurality of arc fault sensors 210A, 210B, 210C, 210D, 210E, 210F may be arranged to have the same signal path length between each arc fault sensor and the arc fault detector 214 alleviating the need for such correction factor(s) to compensate for different signal path lengths.

The arc fault detector 214 is configured to determine a location of an arc fault in the electrical power distribution system 202 based at least on one or more arc fault signals received from one or more capacitive arc fault sensors. The arc fault detector 214 may include any suitable combination of hardware, firmware, and/or software to execute any suitable algorithm to determine a location of an arc fault based on one or more arc fault signals.

In one example where the arc fault detector 214 receives an arc fault signal from a single capacitive arc fault sensor, the arc fault detector 214 is configured to determine that the location of the arc fault is on the segment corresponding to the capacitive arc fault sensor that sent the single arc fault signal to the arc fault detector 214. In this case, the other capacitive arc fault sensors may not report any high-frequency voltage distortions.

In another example where the arc fault detector 214 receives a plurality of arc fault signals from a plurality of arc fault sensors, such as in the illustrated example, the arc fault detector 214 is configured to determine a location of an arc fault based at least on a difference in magnitudes of the plurality of arc fault signals (also accounting for any correction factors that are applied to compensate for signal path lengths between different sensors and the arc fault detector 214). For example, if the arc fault detector receives arc fault signals from both the first and third arc fault sensors 210A and 210C, then the arc fault detector 214 determines that the arc fault is located on the first segment 212A.

Further, in some embodiments, the arc fault detector 214 may compare the magnitudes of these arc fault signals to make a more granular determination of where on the first segment 212A the arc fault is located. For example, if the magnitude of arc fault signal received from the first arc fault sensor 210A is greater than the magnitude of the arc fault signal received from the third arc fault sensor 210C, then the arc fault detector 214 determines that the arc fault 216 is located on the first segment 212A closer to the DC power source 208 than the motor controller 206. In some embodiments, the arc fault detector 214 may be configured to apply a distance function to the magnitudes to estimate a location of the arc fault 216 on the first segment 212A. The arc fault detector 214 may determine the location of an arc fault with any suitable granularity using any suitable algorithm. Note that the magnitudes used by the arc fault detector 214 may have correction factor(s) applied to them to account for different signal path lengths between different capacitive arc fault sensors and the arc fault detector 214.

Figure 3:
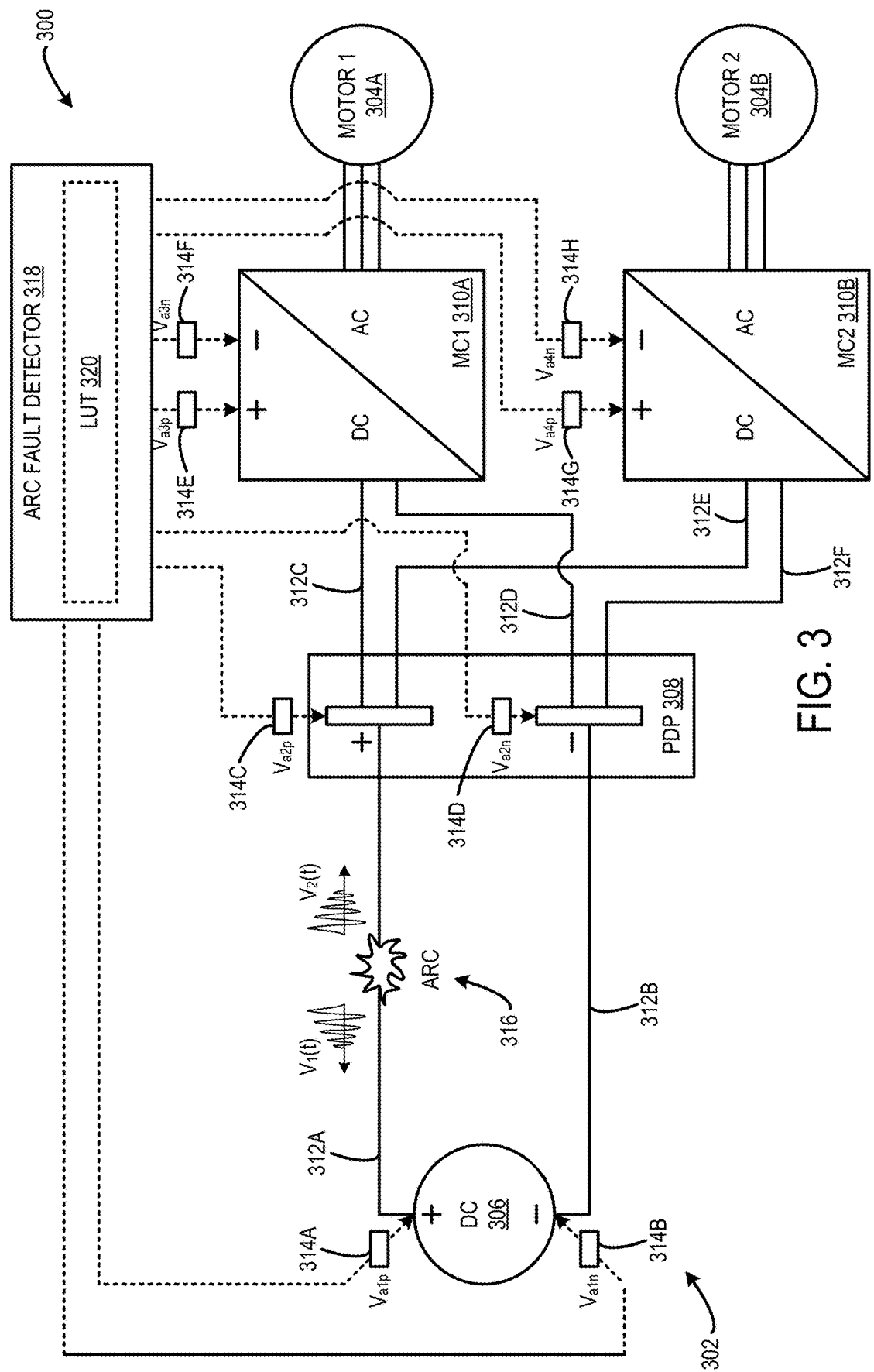
FIG. 3 schematically shows another example embodiment of an arc fault detection system for an electrical power distribution system including a plurality of electric motors.

FIG. 3 schematically shows another example embodiment of an arc fault detection system 300 for an electrical power distribution system 302 including a plurality of electric motors 304A, 304B. For example, the electrical power distribution system 302 may be representative of the electrical power distribution system 102 and the arc fault detection system 300 may be representative of the arc fault detection system 114 shown in FIG. 1. The electrical power distribution system 302 has more segments than the electrical power distribution system 202 shown in FIG. 2. Correspondingly, the arc fault detection system 300 includes more capacitive arc fault sensors than the arc fault detection system 200 in order to monitor for arc faults on the additional segments.

The electrical power distribution system 302 includes a DC power source 306, a PDP 308, a first motor controller 310A, a second motor controller 310B, the first electric motor 304A, and the second electric motor 304B. The DC power source 306 is configured to output DC electrical power to the PDP 308. The PDP 308 is configured to distribute electrical power received from the DC power source 306 to two parallel loads in the form of the first and second motor controllers 310A, 310B electrically connected to the corresponding pair of electric motors 304A, 304B. The first and second motor controllers 310A, 310B are configured to modulate electrical power received from the PDP 308 to control the speed and/or torque of the electric motors 304A, 304B. The electrical power distribution system 302 includes a plurality of segments 312A, 312B, 312C, 312D, 312E, 312F that electrically connect different electronic components of the electrical power distribution system 302. A first segment 312A electrically connects a positive output terminal of the DC power source 306 to a positive terminal of the PDP 308. A second segment 312B electrically connects a negative output terminal of the DC power source 306 to a negative terminal of the PDP 308. A third segment 312C electrically connects the positive terminal of the PDP 308 to a positive terminal of the first motor controller 310A. A fourth segment 312D electrically connects a negative terminal of the PDP 308 to a negative terminal of the first motor controller 310A. A fifth segment 312E electrically connects the positive terminal of the PDP 308 to a positive terminal of the second motor controller 310B. A sixth segment 312F electrically connects the negative terminal of the PDP 308 to a negative terminal of the second motor controller 310B.

The arc fault detection system 300 includes a plurality of capacitive arc fault sensors 314A, 314B, 314C, 314D, 314E, 314F, 314G, 314H electrically connected to the plurality of segments 312A, 312B, 312C, 312D, 312E, 312F. A first capacitive arc fault sensor 314A is electrically connected to the first segment 312A at a positive terminal of the DC power source 306. A second capacitive arc fault sensor 314B is electrically connected to the second segment 312B at a negative terminal of the DC power source 306. A third capacitive arc fault sensor 314C is electrically connected to the first segment 312A at a positive terminal of the PDP 308. A fourth capacitive arc fault sensor 314D is electrically connected to the second segment 312B at a negative terminal of the PDP 308. A fifth capacitive arc fault sensor 314E is electrically connected to the third segment 312C at a positive terminal of the first motor controller 310A. A sixth capacitive arc fault sensor 314F is electrically connected to the fourth segment 312D at a negative terminal of the first motor controller 310A. A seventh capacitive arc fault sensor 314G is electrically connected to the fifth segment 312E at a positive terminal of the second motor controller 310B. An eighth capacitive arc fault sensor 314H is electrically connected to the sixth segment 312F at a negative terminal of the second motor controller 310B.

Although not shown for purposes of clarity, in some embodiments, the arc fault detection system 300 may include additional capacitive arc fault sensors positioned on the segment between the first motor controller 310A and the first electric motor 304A and the segment between the second motor controller 310B and the second electric motor 304B. Such additional capacitive arc fault sensors may operate in the same manner as the other capacitive arc fault sensors of the arc fault detection system 300 described herein.

Each of the plurality of capacitive arc fault sensors 314A, 314B, 314C, 314D, 314E, 314F, 314G, 314H is configured to output an arc fault signal based at least on detecting a high frequency current generated from capacitively coupling with an electrical arc. In particular, each of the plurality of capacitive arc fault sensors 314A, 314B, 314C, 314D, 314E, 314F, 314G, 314H produce a voltage as a response to detecting the high frequency content of current generated from capacitively coupling with an electrical arc. The first capacitive arc fault sensor 314A outputs an arc fault signal having a voltage $V_{a1p}$. The second capacitive arc fault sensor 314B outputs an arc fault signal having a voltage $V_{a1n}$. The third capacitive arc fault sensor 314C outputs an arc fault signal having a voltage $V_{a2p}$. The fourth capacitive arc fault sensor 314D outputs an arc fault signal having a voltage $V_{a2n}$. The fifth capacitive arc fault sensor 314E outputs an arc fault signal having a voltage $V_{a3p}$. The sixth capacitive arc fault sensor 314F outputs an arc fault signal having a voltage $V_{a3n}$. The seventh capacitive arc fault sensor 314G outputs an arc fault signal having a voltage $V_{a4p}$. The eighth capacitive arc fault sensor 314H outputs an arc fault signal having a voltage $V_{a4n}$.

In the illustrated embodiment, an arc fault 316 is incepted on the positive segment 312A between the DC power source 306 and the PDP 308 and generates an electrical energy wave that propagates bi-directionally along the positive segment 312A. The electrical energy wave produced by the arc fault 316 has a signature that is defined by a high-frequency voltage distortion. Upon the electrical energy wave reaching the different capacitive arc fault sensors, the different capacitive arc fault sensors report arc fault signals to an arc fault detector 318.

The arc fault detector 318 is electrically connected to the plurality of capacitive arc fault sensors 314A, 314B, 314C, 314D, 314E, 314F, 314G, 314H. The arc fault detector 318 is configured to receive one or more arc fault signals from one or more capacitive arc fault sensors of the plurality of capacitive arc fault sensors 314A, 314B, 314C, 314D, 314E, 314F, 314G, 314H, and determine a location of an arc fault in the electrical power distribution system 302 based at least on the one or more arc fault signals.

In some embodiments, the arc fault detector 318 is configured to apply one or more correction factors to one or more phases (or one or more times of arrivals) of one or more arc fault signals of the plurality of arc fault signals to account for propagation delays due to differences in lengths of signal paths of the plurality of arc fault signals. In some examples, the correction factor(s) may be a function of signal path lengths between each of the plurality of capacitive arc fault sensors 314A, 314B, 314C, 314D, 314E, 314F, 314G, 314H and the arc fault detector 318.

The arc fault detector 318 is configured to determine the location of an arc fault based at least on a difference in magnitudes, times of arrivals, and/or a difference in phases of arc fault signals received from the plurality of capacitive arc fault sensors 314A, 314B, 314C, 314D, 314E, 314F, 314G, 314H. In the illustrated embodiment, since the arc fault detector 318 is monitoring an increased number of segments relative to the arc fault detection system 200 shown in FIG. 2, the arc fault detector 318 may employ more complex detection algorithms or other logic to determine the location of an arc fault on a particular segment among all the segments being monitored.

In some embodiments, the arc fault detector 318 includes a lookup table (LUT) 320 configured to map magnitudes, times of arrivals, and/or phases of one or more received arc fault signals to one or more potential locations in the electrical power distribution system 302. In such embodiments, the location of the arc fault is determined based on a location output from the LUT 320.

FIG. 4 shows an example table 400 including arc fault signal magnitudes generated by different capacitive arc fault sensors in response to arc faults occurring in different segments of the electrical power distribution system shown in FIG. 3. For example, the arc fault detector 318 may use a lookup table similar to the table 400 to determine a location of an arc fault in the electrical power distribution system 302. The table 400 includes columns associated with different arc fault signals from different capacitive arc fault sensors. The table 400 includes rows associated with different segments of the electrical power distribution system 302. The table 400 includes magnitudes of arc fault signals of capacitive arc fault sensors only electrically connected to positive segments within the electrical power distribution system 302 for purposes of simplicity. Note that the magnitudes over a specific frequency range of interest shown in the table 400 are generalized as high (H) or medium/low (M/L). The ratio of M/L is to be defined by specifics of a particular architecture such as lengths of segments, gauge of wires, terminations, etc. In practice, such magnitudes may have more precise values and the table would also include magnitudes of arc fault signals of capacitive arc fault sensors electrically connected to negative segments within the electrical power distribution system 302.

According to the table 400, if an arc fault occurs in the first segment 312A between the DC power source 306 and the PDP 308, then the first and third capacitive arc fault sensors 314A, 314C report arc fault signals having high magnitudes, because these sensors are closest to the location of the arc fault. The fifth and seventh capacitive arc fault sensors 314E, 314G report arc fault signals having medium/low magnitudes, because these sensors are located on segments that are further away from the location of the arc fault. Note that these sensors are still able to detect the arc fault because the electrical wave generated by the arc fault travels through the PDP to the third and fifth segments 312C, 312E corresponding to the fifth and seventh capacitive arc fault sensors 314E, 314G.

If an arc fault occurs in the third segment 312C between the PDP 308 and the first motor controller 310A, then the third and fifth capacitive arc fault sensors 314C, 314E report arc fault signals having high magnitudes, because these sensors are closest to the location of the arc fault. The first and seventh capacitive arc fault sensors 314A, 314G report arc fault signals having medium/low magnitudes, because these sensors are located on segments that are further away from the location of the arc fault.

If an arc fault occurs in the fifth segment 312E between the PDP 308 and the second motor controller 310B, then the third and seventh capacitive arc fault sensors 314C, 314G report arc fault signals having high magnitudes, because these sensors are closest to the location of the arc fault. The first and fifth capacitive arc fault sensors 314A, 314E report arc fault signals having medium/low magnitudes, because these sensors are located on segments that are further away from the location of the arc fault.

The table 400 is provided as a non-limiting example of how the arc fault detector 318 may use a lookup table to determine a location of an arc fault in the electrical power distribution system 302. Note that in the illustrated embodiment, the arc fault signal of the third capacitive arc fault sensor should always have a high magnitude based on an arc fault occurring on a positive segment within the electrical power distribution system 302. If the arc fault signal of the third capacitive arc fault sensor does not have a high magnitude, then the third capacitive arc fault sensor may be degraded or the electrical power distribution system 302 may have another issue.

In some embodiments, the arc fault detector 318 is configured to perform analysis on different pairs of arc fault signals received from different capacitive arc fault sensors to determine a magnitude, a time of arrival, and/or a phase associated with each segment of the plurality of segments 312A, 312B, 312C, 312D, 312E, 312F of the electrical power distribution system 302. For example, the pairwise analysis may include comparing the magnitude (e.g., $|V_{a1p}|-V_{a2p}|$) for the first segment 312A against the magnitude (e.g., $|V_{a2p}|-V_{a3p}|$) for the third segment 312C and the magnitude (e.g., $|V_{a2p}|-V_{a4p}|$) for the fifth segment 312E to determine the greatest magnitude of the different segments. Further, the arc fault detector 318 is configured to determine that the location of the arc fault corresponds to a segment having a highest magnitude and/or a lowest phase (and/or shortest time of arrival) of the plurality of segments based on the pairwise analysis of the different arc fault signals.

In some embodiments, the arc fault detector 318 is configured to perform checks against false positive readings in order to improve the robustness of the arc fault detection system 300. More particularly, in some embodiments, after the arc fault detector 318 performs pairwise analysis of the different arc fault signals to determine the segment having the highest magnitude and/or the lowest phase, the arc fault detector 318 is configured to compare the highest magnitude to a magnitude error threshold and compare the lowest phase to a phase error threshold and based on at least one of the magnitude being less than the magnitude error threshold or the lowest phase being greater than the phase error threshold, the arc fault detector 318 determine that the arc fault is a false positive. In some such cases, the false positive may be attributed to system noise.

In some examples, the arc fault detector 318 may be configured to, based at least on a pair of arc fault signals having magnitudes within a magnitude difference threshold and phases within a phase difference threshold, determine a location of the arc fault based at least on a difference in times of arrivals of the arc fault signals. The magnitude difference threshold and phase difference threshold may be set to indicate that the magnitudes and phases are the same or substantially similar (within particular tolerance levels of the thresholds). In other words, when the magnitudes and phases of the two different arc fault signals are the same or similar (while also being the highest magnitude and the lowest phase), that indicates that the capacitive arc fault sensors that issued those arc fault signals are positioned closest to the arc fault (e.g., on opposing sides of a segment where the arc fault occurred). In this scenario, the arc fault detector 318 may determine a location of the arc fault based at least on a difference in the times of arrivals of the two arc fault signals. For example, the location of the arc fault may be estimated based on calculating the distances from the capacitive arc fault sensors as functions of the times of arrivals. In examples where the times of arrivals are substantially the same, the arc fault may be located equidistant from the two capacitive arc fault sensors.

In some embodiments, the arc fault detection system 300 is configured to perform various mitigation operations based at least on detecting an arc fault. As one example, the arc fault detection system 300 is configured to deactivate a particular electronic component that is affected by the arc fault. For example, if an arc fault is detected in the third segment 312C between the PDP 308 and the first motor controller 310A, then the arc fault detection system 300 may deactivate operation of the first electric motor 304A until the issue can be resolved. The arc fault detection system 300 may be configured to perform any suitable mitigation operation in response to detecting an arc fault and determining a location of the arc fault.

In some embodiments, the arc fault detection system 300 is configured to send a notification of an arc fault including the location of the arc fault (e.g., a segment and/or a location within a segment) to the electrical power distribution system 302, and the electrical power distribution system 302 may perform various mitigation operations.

Figure 5:
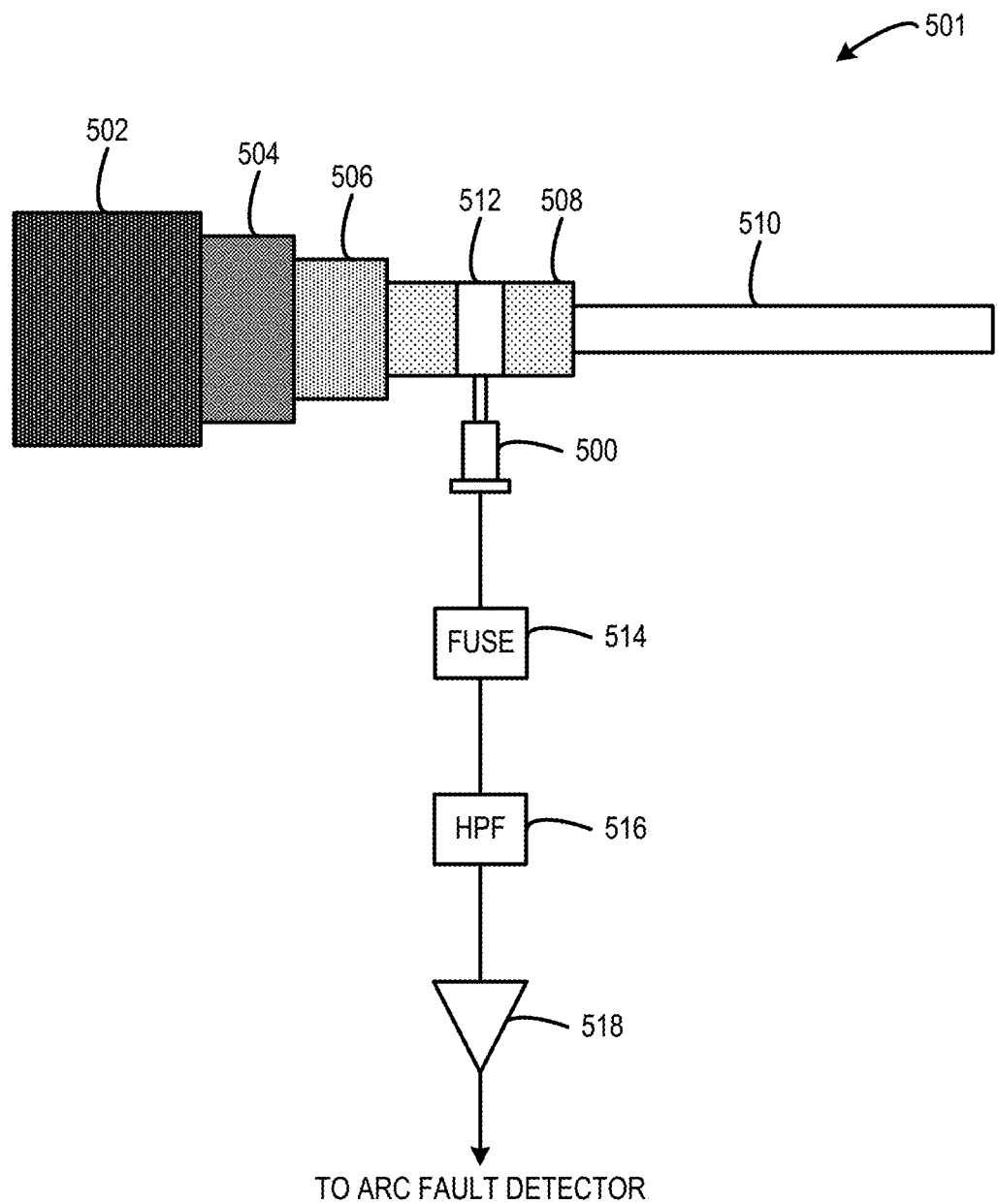
FIG. 5 schematically shows an example embodiment of a capacitive arc fault sensor.

FIG. 5 schematically shows an example embodiment of a capacitive arc fault sensor 500. For example, the capacitive arc fault sensor 500 may be representative of any of the capacitive arc fault sensors of the arc fault detection system 114 shown in FIG. 1, the arc fault detection system 200 shown in FIG. 2, or the arc fault detection system 300 shown in FIG. 3. The capacitive arc fault sensor is electrically connected to a segment in the form of a cable 501. The cable 501 includes a plurality of layers including an exterior jacket 502, an outer insulation layer 504 disposed within the exterior jacket 502, a metallic shield layer 506 disposed within the outer insulation layer 504, an inner insulation layer 508 disposed within the metallic shield layer 506, and a conductor 510 disposed within the inner insulation layer 508. The capacitive arc fault sensor 500 is connected to the inner insulation layer 508 to facilitate capacitive coupling between the arc fault sensor 500 and the conductor 510 when an arc fault occurs on the cable 501.

In some embodiments, the inner insulation layer 508 is wrapped in a conductive wrapper (e.g., conductive foil) 512 at a connection point of the capacitive arc fault sensor 500. The conductive wrapper 512 is not integral to the cable 501, and instead is added during installation of the capacitive arc fault sensor 500 on the cable 501. The conductive wrapper 512 enhances a coupling coefficient of the capacitive arc fault sensor 500 to increase capacitive coupling with the capacitive arc fault sensor 500 when an arc fault occurs.

In some embodiments, a fuse 514 is electrically connected intermediate the capacitive arc fault sensor 500 and the arc fault detector. The fuse 514 protects the arc fault detector from a short circuit condition. For example, a short circuit condition may be created if the inner insulation layer 508 of the cable 501 fails to allow contact between the conductor 510 and the capacitive arc fault sensor 500.

In some embodiments, a high-pass filter (HPF) 516 is electrically connected intermediate the capacitive arc fault sensor 500 and the arc fault detector. The high-pass filter 516 filters out lower frequency system noise to increase the signal-to-noise (SNR) of the high-frequency content of an arc fault signal output from the capacitive arc fault sensor 500.

In some embodiments, a signal amplifier 518 is electrically connected intermediate the capacitive arc fault sensor 500 and the arc fault detector. The signal amplifier 518 increases a signal level of the arc fault signal output from the capacitive arc fault sensor 500 to increase the overall SNR of the arc fault signal provided to the arc fault detector.

Figure 6:
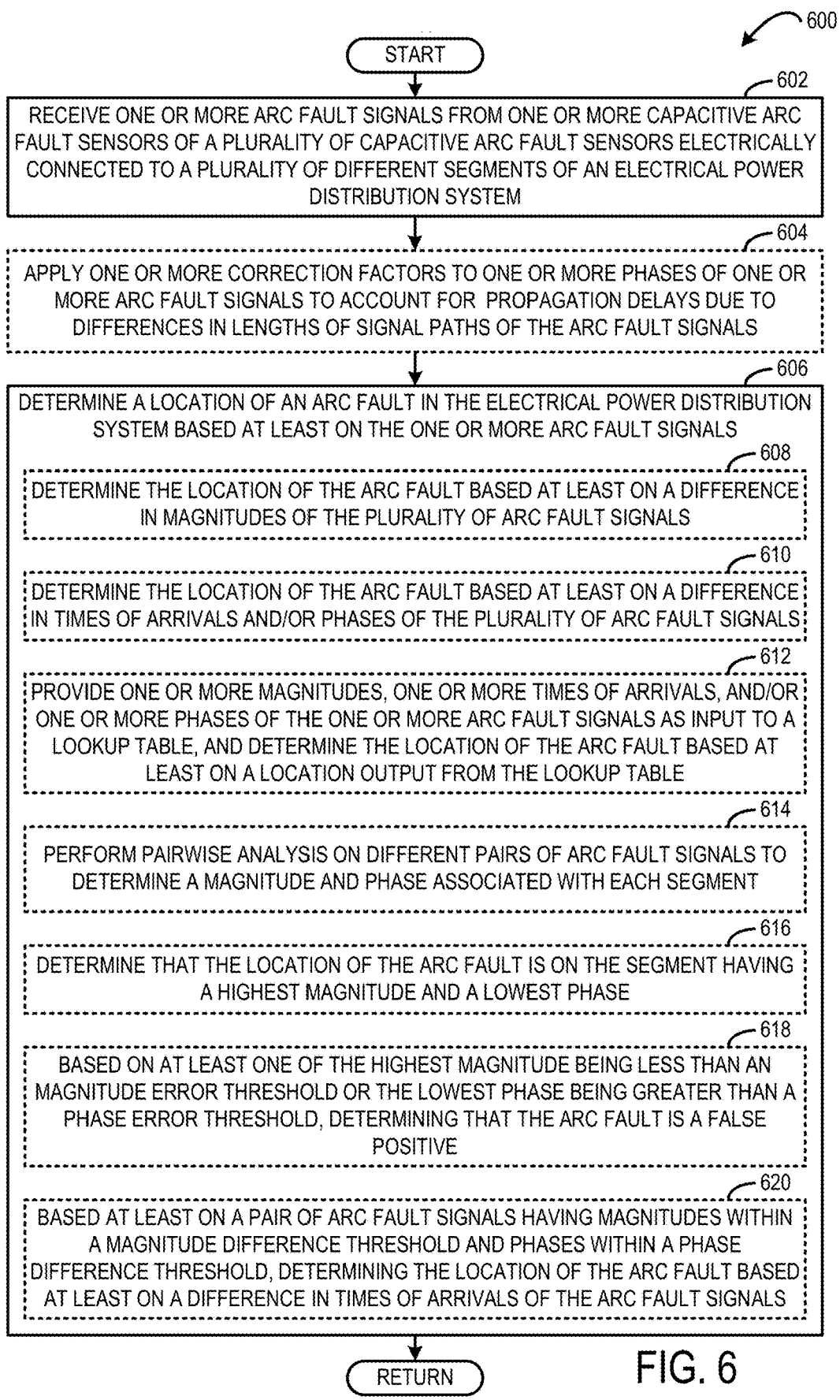
FIG. 6 shows an example embodiment of an arc fault detection method.

FIG. 6 shows an example embodiment of an arc fault detection method 600. For example, the method 600 may be performed by the arc fault detector 118 shown in FIG. 1, the arc fault detector 214 shown in FIG. 2, or the arc fault detector 318 shown in FIG. 3.

At 602, the method 600 includes receiving one or more arc fault signals from one or more capacitive arc fault sensors of a plurality of capacitive arc fault sensors electrically connected to a plurality of different segments of an electrical power distribution system. An arc fault signal is output from a capacitive arc fault sensor based at least on the capacitive arc fault sensor detecting a high frequency current generated from capacitively coupling with an electrical arc.

In some embodiments, at 604, the method 600 may include applying one or more correction factors to one or more times of arrivals and/or phases of one or more arc fault signals of the plurality of arc fault signals to account for propagation delays due to differences in lengths of signal paths of the plurality of arc fault signals.

At 606, the method 600 includes determining a location of an arc fault in the electrical power distribution system based at least on the one or more arc fault signals.

In some embodiments, at 608, the method 600 may include determining the location of the arc fault based at least on a difference in magnitudes of the plurality of arc fault signals. For example, a segment of the electrical power distribution system that is connected to a capacitive arc fault sensor that outputs an arc fault signal having the greatest magnitude may be determined to be the location of the arc fault. In some examples, the magnitudes that are being compared for the location determination may be corrected based on the correction factor(s) to account for differences in signal path length.

In some embodiments, at 610, the method 600 may include determining the location of the arc fault based at least on a difference in times of arrivals and/or phases of the plurality of arc fault signals. For example, a segment of the electrical power distribution system that is connected to a capacitive arc fault sensor that outputs an arc fault signal having the shortest time of arrival and/or the lowest phase may be determined to be the location of the arc fault. In some examples, the phases that are being compared for the location determination may be corrected based on the correction factor(s) to account for differences in signal path length.

In some embodiments, at 612, the method 600 may include providing one or more magnitudes, one or more times of arrivals, and one or more phases of the one or more arc fault signals as input to a lookup table. The lookup table is configured to map the one or more magnitudes, the times of arrivals, and/or the one or more phases of the one or more arc fault signals to one or more locations in the electrical power distribution system, and the location of the arc fault is determined based on a location output from the lookup table.

In some embodiments, at 614, the method 600 may include performing pairwise analysis on different pairs of arc fault signals received from a plurality of capacitive arc fault sensors to determine a magnitude, time of arrival, and/or phase associated with each segment of the plurality of segments of the electrical power distribution system.

In some embodiments, at 616, the method 600 may include determining that the location of the arc fault is on the segment having a highest magnitude and a shortest time of arrival and/or lowest phase of the plurality of segments.

In some embodiments, at 618, the method 600 may include comparing the highest magnitude to a magnitude error threshold, comparing the lowest phase to a phase error threshold; and based on at least one of the magnitude being less than the magnitude error threshold or the lowest phase being greater than the phase error threshold, determining that the arc fault is a false positive.

In some embodiments, at 620, the method 600 may include based at least on a pair of arc fault signals having magnitudes within a magnitude difference threshold and phases within a phase difference threshold, determining the location of the arc fault based at least on a difference in times of arrivals of the arc fault signals. The magnitude difference threshold and phase difference threshold may be set to indicate that the magnitudes and phases are the same or substantially similar (within particular tolerance levels of the thresholds). In other words, when the magnitudes and phases of the two different arc fault signals are the same or similar (while also being the highest magnitude and the lowest phase), that indicates that the capacitive arc fault sensors that issued those arc fault signals are positioned closest to the arc fault (e.g., on opposing sides of a segment where the arc fault occurred). In this scenario, the location of the arc fault may be determined based at least on a difference in the times of arrivals of the two arc fault signals. For example, the location of the arc fault may be estimated based on calculating the distances from the capacitive arc fault sensors as functions of the times of arrivals. In examples where the times of arrivals are substantially the same, the arc fault may be located equidistant from the two capacitive arc fault sensors.

The arc fault detection method described above may be performed to accurately detect the location of an arc fault in an electrical power distribution system.

Figure 7:
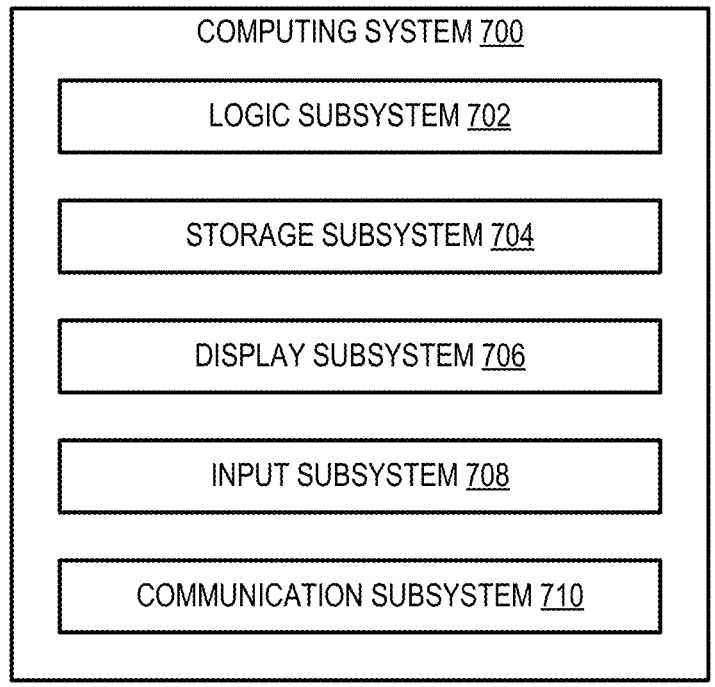
FIG. 7 shows an example embodiment of a computing system.

The methods and processes described herein may be tied to a computing system of one or more computing devices. FIG. 7 schematically shows a simplified representation of a computing system 700 configured to provide any to all of the compute functionality described herein. For example, the computing system 700 may be representative of the arc fault detector 118 shown in FIG. 1, the arc fault detector 214 shown in FIG. 2, or the arc fault detector 318 shown in FIG. 3.

Computing system 700 includes a logic subsystem 702 and a storage subsystem 704. Computing system 700 may optionally include a display subsystem 706, input subsystem 708, communication subsystem 710, and/or other subsystems not shown in FIG. 7.

Logic subsystem 702 includes one or more physical devices configured to execute instructions. For example, the logic subsystem may be configured to execute instructions that are part of one or more applications, services, or other logical constructs. The logic subsystem may include one or more hardware processors configured to execute software instructions. Additionally, or alternatively, the logic subsystem may include one or more hardware or firmware devices configured to execute hardware or firmware instructions. Processors of the logic subsystem may be single-core or multi-core, and the instructions executed thereon may be configured for sequential, parallel, and/or distributed processing. Individual components of the logic subsystem optionally may be distributed among two or more separate devices, which may be remotely located and/or configured for coordinated processing. Aspects of the logic subsystem may be virtualized and executed by remotely-accessible, networked computing devices configured in a cloud-computing configuration.

Storage subsystem 704 includes one or more physical devices configured to temporarily and/or permanently hold computer information such as data and instructions executable by the logic subsystem. When the storage subsystem includes two or more devices, the devices may be collocated and/or remotely located. Storage subsystem 704 may include volatile, nonvolatile, dynamic, static, read/write, read-only, random-access, sequential-access, location-addressable, file-addressable, and/or content-addressable devices. Storage subsystem 704 may include removable and/or built-in devices. When the logic subsystem executes instructions, the state of storage subsystem 704 may be transformed—e.g., to hold different data.

Aspects of logic subsystem 702 and storage subsystem 704 may be integrated together into one or more hardware-logic components. Such hardware-logic components may include program- and application-specific integrated circuits (PASIC/ASICs), program- and application-specific standard products (PSSP/ASSPs), system-on-a-chip (SOC), and complex programmable logic devices (CPLDs), for example.

The logic subsystem and the storage subsystem may cooperate to instantiate one or more logic machines. As used herein, the term "machine" is used to collectively refer to the combination of hardware, firmware, software, instructions, and/or any other components cooperating to provide computer functionality. In other words, "machines" are never abstract ideas and always have a tangible form. A machine may be instantiated by a single computing device, or a machine may include two or more sub-components instantiated by two or more different computing devices. In some implementations a machine includes a local component (e.g., software application executed by a computer processor) cooperating with a remote component (e.g., cloud computing service provided by a network of server computers). The software and/or other instructions that give a particular machine its functionality may optionally be saved as one or more unexecuted modules on one or more suitable storage devices.

When included, display subsystem 706 may be used to present a visual representation of data held by storage subsystem 704. This visual representation may take the form of a graphical user interface (GUI). Display subsystem 706 may include one or more display devices utilizing virtually any type of technology. In some implementations, display subsystem may include one or more virtual-, augmented-, or mixed reality displays.

When included, input subsystem 708 may comprise or interface with one or more input devices. An input device may include a sensor device or a user input device. Examples of user input devices include a keyboard, mouse, touch screen, or game controller.

When included, communication subsystem 710 may be configured to communicatively couple computing system 700 with one or more other computing devices. Communication subsystem 710 may include wired and/or wireless communication devices compatible with one or more different communication protocols. The communication subsystem may be configured for communication via personal-, local- and/or wide-area networks.

In an example, an arc fault detection system comprises a plurality of capacitive arc fault sensors electrically connected to a plurality of different segments of an electrical power distribution system, wherein each capacitive arc fault sensor is configured to output an arc fault signal based at least on detecting a high frequency current generated from capacitively coupling with an electrical arc, and an arc fault detector electrically connected to the plurality of capacitive arc fault sensors, wherein the arc fault detector is configured to receive one or more arc fault signals from one or more capacitive arc fault sensors of the plurality of capacitive arc fault sensors, and determine a location of an arc fault in the electrical power distribution system based at least on the one or more arc fault signals. In this example and/or other examples, the arc fault detector may receive a plurality of arc fault signals from the plurality of capacitive arc fault sensors, and the arc fault detector may be configured to determine the location of the arc fault based at least on a difference in magnitudes of the plurality of arc fault signals. In this example and/or other examples, the arc fault detector may receive a plurality of arc fault signals from the plurality of capacitive arc fault sensors, and the arc fault detector may be configured to determine the location of the arc fault based on at least a difference in times of arrivals and/or a difference in phases of the plurality of arc fault signals. In this example and/or other examples, the arc fault detector may be configured to apply one or more correction factors to one or more times of arrivals and/or one or more phases of one or more arc fault signals of the plurality of arc fault signals to account for propagation delays due to differences in lengths of signal paths of the plurality of arc fault signals. In this example and/or other examples, the arc fault detector may include a lookup table configured to map one or more magnitudes, times of arrivals, and/or one or more phases of the one or more arc fault signals to one or more locations in the electrical power distribution system, and wherein the location of the arc fault is determined based on a location output from the lookup table. In this example and/or other examples, the arc fault detector may be configured to perform analysis on different pairs of arc fault signals received from different capacitive arc fault sensors of the plurality of capacitive arc fault sensors to determine a magnitude, a time of arrival, and/or a phase associated with each segment of the plurality of different segments of the electrical power distribution system, and the location of the arc fault is determined to correspond to a segment having a highest magnitude and a lowest phase of the plurality of different segments. In this example and/or other examples, the arc fault detector may be configured to compare a highest magnitude of a corresponding segment to a magnitude error threshold and compare a lowest phase of a corresponding segment to a phase error threshold and, based on at least one of the highest magnitude being less than the magnitude error threshold or the lowest phase being greater than the phase error threshold, determine that the arc fault is a false positive. In this example and/or other examples, the arc fault detector may be configured to, based at least on a pair of arc fault signals having magnitudes within a magnitude differences threshold and phases within a phase difference threshold, determine the location of the arc fault based at least on a difference in times of arrivals of the arc fault signals. In this example and/or other examples, the plurality of capacitive arc fault sensors may include a first capacitive arc fault sensor and a second capacitive arc fault sensor, the first capacitive arc fault sensor may be electrically connected to a first segment that is electrically connected to a positive output node of a direct current (DC) power source of the electrical power distribution system, and the second capacitive arc fault sensor may be electrically connected to a second segment that is electrically connected to a negative output node of the DC power source. In this example and/or other examples, the electrical distribution system may be configured to distribute electrical power to a plurality of electric motors, the plurality of motors may be controlled by a corresponding plurality of motor controllers that are electrically connected to the DC power source via a plurality of segments of the electrical distribution system, and the plurality of capacitive arc fault sensors may be electrically connected to the plurality of segments that are intermediate the corresponding plurality of motor controllers and the DC power source. In this example and/or other examples, the electrical distribution system may include a power distribution panel (PDP) electrically connected to the DC power source and intermediate the corresponding plurality of motor controllers and the DC power source, and the plurality of capacitive arc fault sensors include a first sub-set of capacitive arc fault sensors electrically connected to segments that are intermediate the DC power source and the PDP, and a second sub-set of capacitive arc fault sensors electrically connected to segments that are intermediate the PDP and the corresponding plurality of motor controllers.

In another example, an arc fault detection method for an electrical power distribution system comprises receiving one or more arc fault signals from one or more capacitive arc fault sensors of a plurality of capacitive arc fault sensors electrically connected to a plurality of different segments of the electrical power distribution system, wherein each capacitive arc fault sensor of the plurality of capacitive arc fault sensors is configured to output an arc fault signal based at least on detecting a high frequency current generated from capacitively coupling with an electrical arc, and determining a location of an arc fault in the electrical power distribution system based at least on the one or more arc fault signals. In this example and/or other examples, the method may further comprise receiving a plurality of arc fault signals from the plurality of capacitive arc fault sensors, and determining the location of the arc fault based at least on a difference in magnitudes of the plurality of arc fault signals. In this example and/or other examples, the method may further comprise receiving a plurality of arc fault signals from the plurality of capacitive arc fault sensors, and determining the location of the arc fault based on at least a difference in times of arrivals and/or phases of the plurality of arc fault signals. In this example and/or other examples, the method may further comprise applying one or more correction factors to one or more times of arrivals and/or one or more phases of one or more arc fault signals of the plurality of arc fault signals to account for propagation delays due to differences in lengths of signal paths of the plurality of arc fault signals. In this example and/or other examples, said determining the location of the arc fault may include providing one or more magnitudes, one or more times of arrivals, and/or one or more phases of the one or more arc fault signals as input to a lookup table, the lookup table may be configured to map the one or more magnitudes, the one or more times of arrivals, and/or the one or more phases of the one or more arc fault signals to one or more locations in the electrical power distribution system, and the location of the arc fault may be determined based on a location output from the lookup table. In this example and/or other examples, the method may further comprise receiving a plurality of arc fault signals from the plurality of capacitive arc fault sensors, and performing analysis on different pairs of arc fault signals received from the plurality of capacitive arc fault sensors to determine a magnitude and a phase associated with each segment of the plurality of different segments of the electrical power distribution system, and wherein the location of the arc fault is determined to be on a segment having a highest magnitude and a lowest phase of the plurality of different segments. In this example and/or other examples, the method may further comprise comparing the highest magnitude of a corresponding segment to a magnitude error threshold, comparing the lowest phase of a corresponding segment to a phase error threshold, and based on at least one of the highest magnitude being less than the magnitude error threshold or the lowest phase being greater than the phase error threshold, determining that the arc fault is a false positive.

In yet another example, a storage subsystem holds instructions executable by a logic subsystem to: receive one or more arc fault signals from one or more capacitive arc fault sensors of a plurality of capacitive arc fault sensors electrically connected to a plurality of different segments of an electrical power distribution system, wherein each capacitive arc fault sensor of the plurality of capacitive arc fault sensors is configured to output an arc fault signal based at least on detecting a high frequency current generated from capacitively coupling with an electrical arc, and determine a location of an arc fault in the electrical power distribution system based at least on the one or more arc fault signals. In this example and/or other examples, the instructions may be executable by the logic subsystem to receive a plurality of arc fault signals from the plurality of capacitive arc fault sensors, and determine the location of the arc fault based at least on a difference in magnitudes of the plurality of arc fault signals, a difference in times of arrivals of the plurality of arc fault signals, and/or a difference in phases of the plurality of arc fault signals.

The present disclosure includes all novel and non-obvious combinations and subcombinations of the various features and techniques disclosed herein. The various features and techniques disclosed herein are not necessarily required of all examples of the present disclosure. Furthermore, the various features and techniques disclosed herein may define patentable subject matter apart from the disclosed examples and may find utility in other implementations not expressly disclosed herein.

The invention claimed is:

1. An arc fault detection system comprising:
a plurality of capacitive arc fault sensors electrically connected to a plurality of different segments of an electrical power distribution system, wherein each capacitive arc fault sensor is configured to output an arc fault signal based at least on detecting a high frequency current generated from capacitively coupling with an electrical arc; and
an arc fault detector electrically connected to the plurality of capacitive arc fault sensors, wherein the arc fault detector is configured to:
receive one or more arc fault signals from one or more capacitive arc fault sensors of the plurality of capacitive arc fault sensors; and
determine a location of an arc fault in the electrical power distribution system based at least on the one or more arc fault signals.

2. The arc fault detection system of claim 1, wherein the arc fault detector receives a plurality of arc fault signals from the plurality of capacitive arc fault sensors, and wherein the arc fault detector is configured to determine the location of the arc fault based at least on a difference in magnitudes of the plurality of arc fault signals.

3. The arc fault detection system of claim 1, wherein the arc fault detector receives a plurality of arc fault signals from the plurality of capacitive arc fault sensors, and wherein the arc fault detector is configured to determine the location of the arc fault based on at least a difference in times of arrival and/or a difference in phases of the plurality of arc fault signals.

4. The arc fault detection system of claim 3, wherein the arc fault detector is configured to apply one or more correction factors to one or more times of arrivals and/or one or more phases of one or more arc fault signals of the plurality of arc fault signals to account for propagation delays due to differences in lengths of signal paths of the plurality of arc fault signals.

5. The arc fault detection system of claim 1, wherein the arc fault detector includes a lookup table configured to map one or more magnitudes, one or more times of arrivals, and/or one or more phases of the one or more arc fault signals to one or more locations in the electrical power distribution system, and wherein the location of the arc fault is determined based on a location output from the lookup table.

6. The arc fault detection system of claim 1, wherein the arc fault detector is configured to perform analysis on different pairs of arc fault signals received from different capacitive arc fault sensors of the plurality of capacitive arc fault sensors to determine a magnitude and a phase associated with each segment of the plurality of different segments of the electrical power distribution system, and wherein the location of the arc fault is determined to correspond to a segment having a highest magnitude and a lowest phase of the plurality of different segments.

7. The arc fault detection system of claim 6, wherein the arc fault detector is configured to compare a highest magnitude of a corresponding segment to a magnitude error threshold and compare a lowest phase of a segment to a phase error threshold and, based on at least one of the highest magnitude being less than the magnitude error threshold or the lowest phase being greater than the phase error threshold, determine that the arc fault is a false positive.

8. The arc fault detection system of claim 6, wherein the arc fault detector is configured to, based at least on a pair of arc fault signals having magnitudes within a magnitude differences threshold and phases within a phase difference threshold, determine the location of the arc fault based at least on a difference in times of arrivals of the arc fault signals.

9. The arc fault detection system of claim 1, wherein the plurality of capacitive arc fault sensors includes a first capacitive arc fault sensor and a second capacitive arc fault sensor, wherein the first capacitive arc fault sensor is electrically connected to a first segment that is electrically connected to a positive output node of a direct current (DC) power source of the electrical power distribution system, and wherein the second capacitive arc fault sensor is electrically connected to a second segment that is electrically connected to a negative output node of the DC power source.

10. The arc fault detection system of claim 9, wherein the electrical distribution system is configured to distribute electrical power to a plurality of electric motors, wherein the plurality of motors are controlled by a corresponding plurality of motor controllers that are electrically connected to the DC power source via a plurality of segments of the electrical distribution system, and wherein the plurality of capacitive arc fault sensors are electrically connected to the plurality of segments that are intermediate the corresponding plurality of motor controllers and the DC power source.

11. The arc fault detection system of claim 10, wherein the electrical distribution system includes a power distribution panel (PDP) electrically connected to the DC power source and intermediate the corresponding plurality of motor controllers and the DC power source, and wherein the plurality of capacitive arc fault sensors include a first sub-set of capacitive arc fault sensors electrically connected to segments that are intermediate the DC power source and the PDP, and a second sub-set of capacitive arc fault sensors electrically connected to segments that are intermediate the PDP and the corresponding plurality of motor controllers.

12. An arc fault detection method for an electrical power distribution system, the method comprising:
receiving one or more arc fault signals from one or more capacitive arc fault sensors of a plurality of capacitive arc fault sensors electrically connected to a plurality of different segments of the electrical power distribution system, wherein each capacitive arc fault sensor of the plurality of capacitive arc fault sensors is configured to output an arc fault signal based at least on detecting a high frequency current generated from capacitively coupling with an electrical arc; and
determining a location of an arc fault in the electrical power distribution system based at least on the one or more arc fault signals.

13. The method of claim 12, further comprising:
receiving a plurality of arc fault signals from the plurality of capacitive arc fault sensors; and
determining the location of the arc fault based at least on a difference in magnitudes of the plurality of arc fault signals.

14. The method of claim 12, further comprising:
receiving a plurality of arc fault signals from the plurality of capacitive arc fault sensors; and
determining the location of the arc fault based on at least a difference in times of arrival and/or phases of the plurality of arc fault signals.

15. The method of claim 14, further comprising:
applying one or more correction factors to one or more times of arrival and/or one or more phases of one or more arc fault signals of the plurality of arc fault signals to account for propagation delays due to differences in lengths of signal paths of the plurality of arc fault signals.

16. The method of claim 12, wherein said determining the location of the arc fault includes providing one or more magnitudes, one or more times of arrivals, and/or one or more phases of the one or more arc fault signals as input to a lookup table, wherein the lookup table is configured to map the one or more magnitudes, the one or more times of arrivals, and/or the one or more phases of the one or more arc fault signals to one or more locations in the electrical power distribution system, and wherein the location of the arc fault is determined based on a location output from the lookup table.

17. The method of claim 12, further comprising:
receiving a plurality of arc fault signals from the plurality of capacitive arc fault sensors; and
performing analysis on different pairs of arc fault signals received from the plurality of capacitive arc fault sensors to determine a magnitude and a phase associated with each segment of the plurality of different segments of the electrical power distribution system, and wherein the location of the arc fault is determined to be on a segment having a highest magnitude and a lowest phase of the plurality of different segments.

18. The method of claim 17, further comprising:
comparing the highest magnitude of a corresponding segment to a magnitude error threshold;
comparing the lowest phase of a corresponding segment to a phase error threshold; and
based on at least one of the highest magnitude being less than the magnitude error threshold or the lowest phase being greater than the phase error threshold, determining that the arc fault is a false positive.

19. A storage subsystem holding instructions executable by a logic subsystem to:
receive one or more arc fault signals from one or more capacitive arc fault sensors of a plurality of capacitive arc fault sensors electrically connected to a plurality of different segments of an electrical power distribution system, wherein each capacitive arc fault sensor of the plurality of capacitive arc fault sensors is configured to output an arc fault signal based at least on detecting a high frequency current generated from capacitively coupling with an electrical arc; and
determine a location of an arc fault in the electrical power distribution system based at least on the one or more arc fault signals.

20. The storage subsystem of claim 19, wherein the instructions are further executable by the logic subsystem to:
receive a plurality of arc fault signals from the plurality of capacitive arc fault sensors; and
determine the location of the arc fault based at least on a difference in magnitudes of the plurality of arc fault signals, a difference in times of arrivals of the plurality of arc fault signals, and/or a difference in phases of the plurality of arc fault signals.

* * * * *